(12) United States Patent
Hanson

(10) Patent No.: US 9,101,049 B2
(45) Date of Patent: Aug. 4, 2015

(54) OPACITY BAFFLE TO PREVENT VIEWING OF INTERNAL STRUCTURES IN SECURE ELECTRONIC EQUIPMENT

(71) Applicant: Mark H. Hanson, Eagan, MN (US)

(72) Inventor: Mark H. Hanson, Eagan, MN (US)

(73) Assignee: McAfee Inc.

( * ) Notice: Subject to any disclaimer, the term of this patent is extended or adjusted under 35 U.S.C. 154(b) by 394 days.

(21) Appl. No.: 13/732,938

(22) Filed: Jan. 2, 2013

(65) Prior Publication Data

US 2014/0185237 A1 Jul. 3, 2014

(51) Int. Cl.
*H05K 7/20* (2006.01)
*H05K 5/02* (2006.01)
*F24F 13/08* (2006.01)

(52) U.S. Cl.
CPC ............ *H05K 5/0208* (2013.01); *F24F 13/084* (2013.01); *H05K 5/0239* (2013.01)

(58) Field of Classification Search
CPC .... H05K 5/0208; H05K 5/0239; F24F 13/084
See application file for complete search history.

(56) References Cited

U.S. PATENT DOCUMENTS

| | | | | |
|---|---|---|---|---|
| 4,898,009 | A * | 2/1990 | Lakoski et al. | 70/58 |
| 5,673,029 | A * | 9/1997 | Behl et al. | 340/635 |
| 5,698,818 | A * | 12/1997 | Brench | 174/385 |
| 5,766,285 | A * | 6/1998 | Killman | 55/385.6 |
| 5,935,282 | A * | 8/1999 | Lin | 55/385.6 |
| 6,362,417 | B2 * | 3/2002 | Mitchell et al. | 174/384 |
| 6,426,459 | B1 * | 7/2002 | Mitchell | 174/382 |
| 6,557,385 | B1 * | 5/2003 | Shih | 70/161 |
| 6,616,525 | B1 * | 9/2003 | Giraldo et al. | 454/184 |
| 6,680,847 | B2 * | 1/2004 | Heard | 361/692 |
| 6,690,576 | B2 * | 2/2004 | Clements et al. | 361/695 |
| 6,746,502 | B2 * | 6/2004 | Yair et al. | 55/385.6 |
| 6,805,625 | B2 * | 10/2004 | Champeau et al. | 454/184 |
| 6,896,611 | B2 * | 5/2005 | Giraldo et al. | 454/184 |
| 6,912,123 | B2 * | 6/2005 | Sakai et al. | 361/679.47 |
| 6,927,968 | B2 * | 8/2005 | Pols Sandhu et al. | 361/679.57 |

(Continued)

FOREIGN PATENT DOCUMENTS

DE 9113084 U1 * 10/1991 ................ G96F 1/16
WO 2008-134500 A2 11/2008

OTHER PUBLICATIONS

International Search Report and Written Opinion regarding corresponding PCT application No. PCT/US2013/078198, dated Apr. 1, 2014.

(Continued)

*Primary Examiner* — Robert J Hoffberg
(74) *Attorney, Agent, or Firm* — Blank Rome LLP.

(57) ABSTRACT

An opacity baffle is disclosed that can be permanently secured to the back face of an electronic apparatus to cover ventilation openings or other openings that render the apparatus visually unsecure. The opacity baffle in one example comprises a grill and ventilation material that are secured together at their edges resulting in a rigid structure. The grill contains openings to promote ventilation within the apparatus, and the ventilation materials allows for air flow despite being visually opaque. One-way fasteners can be used to secure the baffle to the back face, which when inserted in place cannot be removed without evident tampering. The baffle and fasteners can be provided with the apparatus when sold or can be sold separately, allowing a particular customer to affix the baffle if needed to meet security requirements, or not if such security measures are unnecessary.

26 Claims, 5 Drawing Sheets

(56) References Cited

U.S. PATENT DOCUMENTS

| | | | |
|---|---|---|---|
| 6,927,976 B1 | 8/2005 | Malone et al. | |
| 7,038,124 B1* | 5/2006 | Sosnowski | 174/383 |
| 7,151,666 B2* | 12/2006 | Song | 361/692 |
| 8,152,885 B2* | 4/2012 | Pfannenberg | 55/478 |
| 2005/0105268 A1* | 5/2005 | Chen et al. | 361/692 |
| 2006/0096189 A1 | 5/2006 | Pavlansky et al. | |
| 2007/0201181 A1 | 8/2007 | Dubrule et al. | |
| 2008/0108439 A1* | 5/2008 | Cole | 463/46 |
| 2009/0116187 A1* | 5/2009 | Yi et al. | 361/692 |
| 2011/0069449 A1 | 3/2011 | Miller et al. | |
| 2014/0085818 A1* | 3/2014 | Lee | 361/690 |

OTHER PUBLICATIONS

National Institute of Standards and Technology. "Federal Information Processing Standards Publication 140-2; Announcing the Standard for Security Requirements for Cryptographic Modules". May 25, 2001. Online Abstract. National Institute of Standards and Technology. Gaithersburt, MD, USA.

McAfee, Inc. "McAfee Web Gateway WG5000 and WG5500 Appliances Hardware Models: 5000, 5500; Firmware Version: 7.1.0; FIPS 140-2 Non-Proprietary Security Policy". Aug. 17, 2012. McAfee, Inc. Santa Clara, CA, USA.

\* cited by examiner

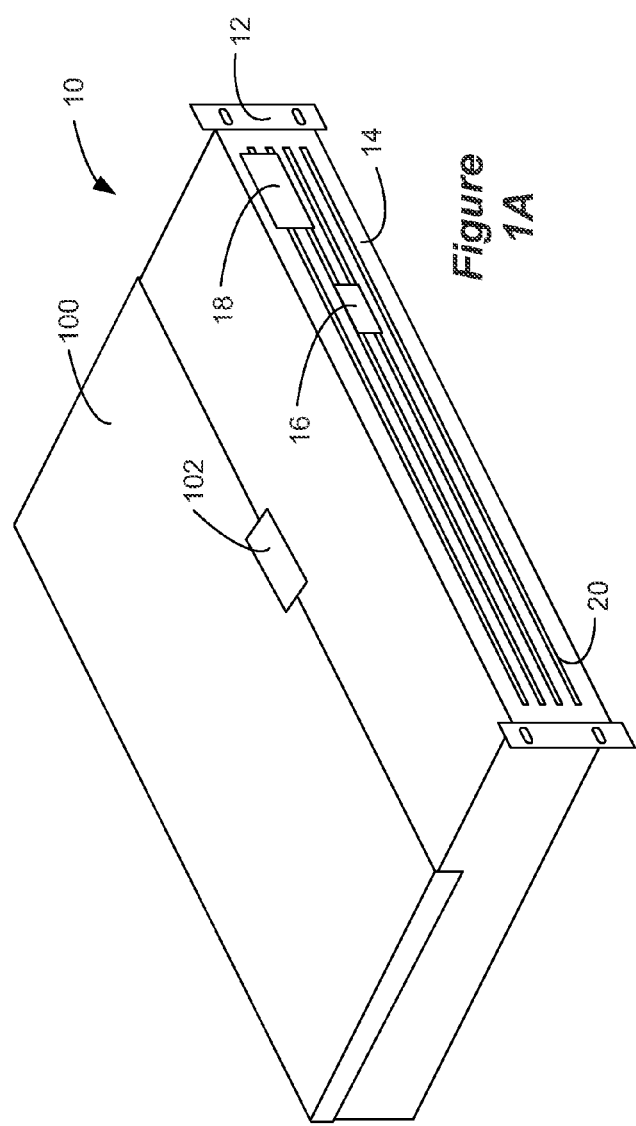
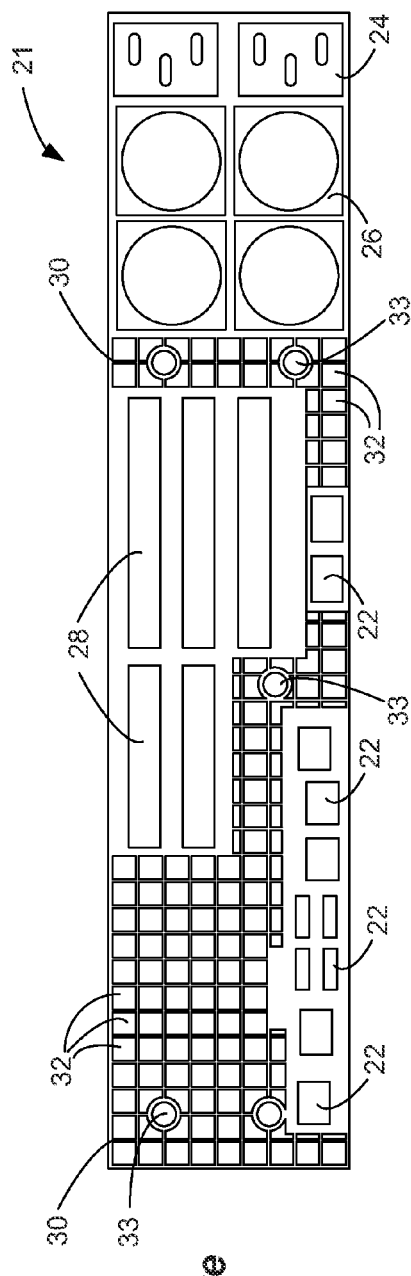
Figure 1A
Figure 1B

OPACITY BAFFLE TO PREVENT VIEWING OF INTERNAL STRUCTURES IN SECURE ELECTRONIC EQUIPMENT

FIELD OF THE INVENTION

The present invention relates to physical security for electronic equipment.

BACKGROUND

It is well known that it is desirable to electronically secure data in certain types of electronic equipment. For example, antivirus or firewall software can operate on a computer to prevent unauthorized access to, and tampering with, secure data. In more complex computer systems, electronic security may also be provided by a cryptographic module, or gateway, which is typically deployed between the computer system and another potentially unsecured network, such as the Internet.

Certain markets further demand that electronic equipment also be physically secure. For example, the 140 series of Federal Information Processing Standards (FIPS) are United States government standards that specify computer security requirements for cryptography modules. FIPS 140-2, which is supplied in the Information Disclosure Statement (IDS) filed with this application, is the latest version of these standards and addresses cryptographic module security in wide range of applications and environments. Compliance with FIPS is required of cryptographic modules used by certain governmental agencies.

FIPS 140-2 specifies four levels of security, each with increasingly more stringent security requirements. Level 2, for example, specifies enhanced physical security mechanisms for a cryptographic module by requiring tamper evidence (e.g., tamper-evident coatings or seals; pick-resistant locks) which must be broken to attain physical access to the plain text cryptographic keys and critical security parameters within the module. Level 2 also generally requires a tamper-evident enclosure that is visually opaque.

Not all customers of cryptographic modules will require such physical security measures, such as some companies in the private sector. This leaves producers of cryptographic modules with difficult choices. A producer can make all cryptographic modules to the highest security standards even if such standard are not required by some customers. This is unfortunate, because physical security measures are generally more difficult and expensive to produce and thus increase the cost of the module, despite the fact that certain markets don't require these measures. Alternatively, the producers can make different cryptographic modules for different markets—i.e., more-physically-secure modules for government markets and less-physically-secure modules for private sector markets. But having to make essentially the same module two different ways is obviously not efficient for the producer.

Regardless, compliance with FIPS-style physical security requirements can be difficult to achieve. Cryptographic modules typically contain a number of open spaces to allow for airflow to cool internal circuitry during its operation. Due to FIPS's requirement of a visually opaque enclosure, such open spaces must be covered to some degree. This has the potential to increase heating in the module, which can adversely affect its operation.

Cost-effective and simple solutions to these problems are desired.

BRIEF DESCRIPTION OF THE DRAWINGS

FIG. 1A shows an electronic apparatus and FIG. 1B shows structures on the back face of the apparatus.

DETAILED DESCRIPTION

Figure 2:
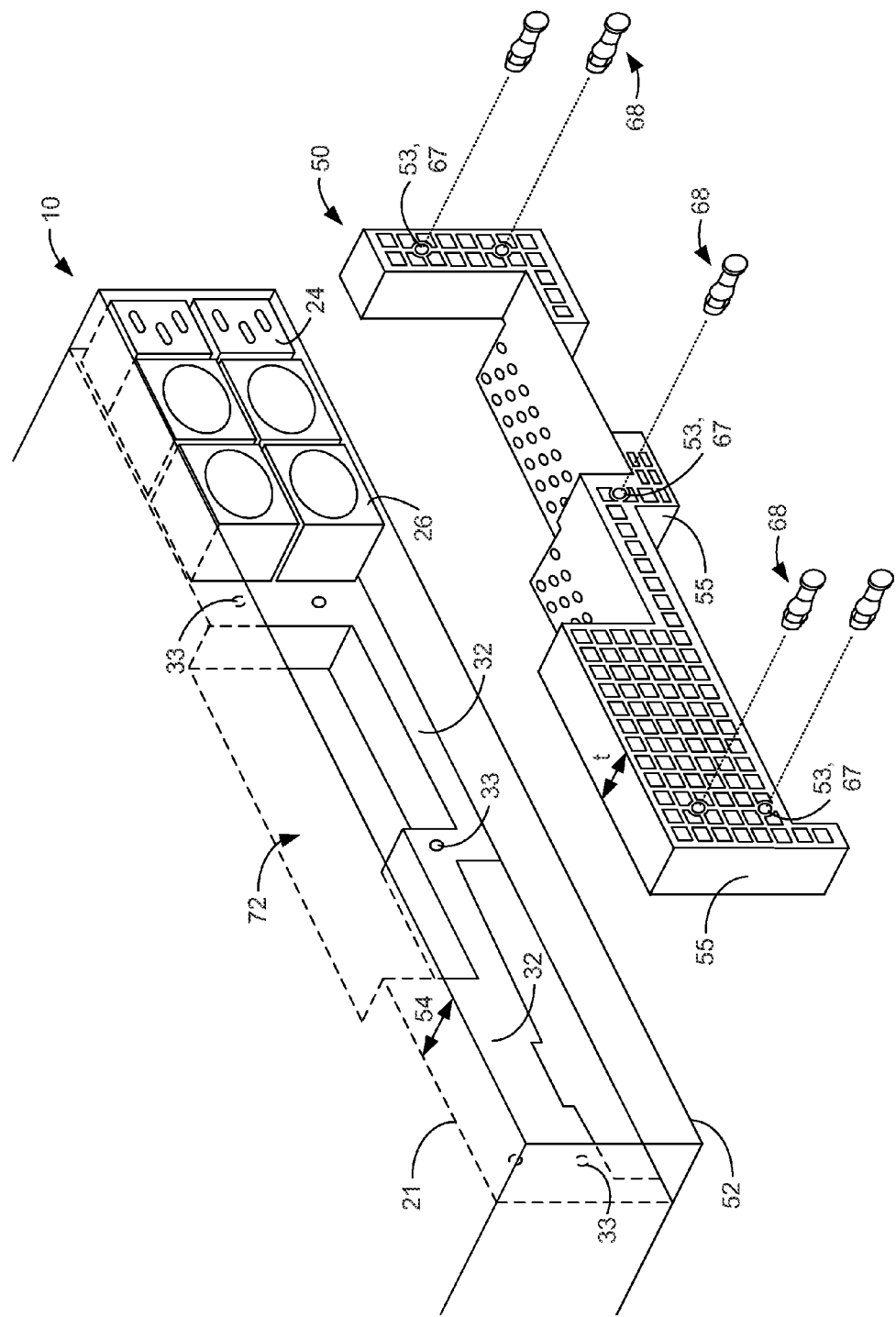
FIGS. 2 and 3 show an opacity baffle used to cover openings in the apparatus's back face, with FIG. 3 showing the baffle affixed to the back face.

An opacity baffle is disclosed that can be permanently secured to the back face of an electronic apparatus, such as a cryptographic module, to cover ventilation openings or other openings that render the apparatus visually unsecure. The opacity baffle in one example comprises a grill and a ventilation material that are secured together at their edges resulting in a rigid structure. The grill contains openings to promote ventilation within the apparatus, and the ventilation material allows for air flow despite being visually opaque. One-way fasteners can be used to secure the baffle to the back face, which when inserted in place cannot be removed without evident tampering. The baffle and fasteners can be provided with the apparatus when sold or can be sold separately, allowing a particular customer to affix the baffle if needed to meet security requirements (such as FIPS 140-2), or not if such security measures are unnecessary. The baffle does not require redesign of the apparatus, thus allowing the producer to cost-effectively produce a single apparatus for secure and non-secure markets.

An electronic apparatus 10 benefitting from the disclosed opacity baffle is shown in FIGS. 1A and 1B, which comprises a McAfee Web Gateway WG5500 cryptographic module. See "McAfee Web Gateway WG5000 and WG5500 Appliances, FIPS 140-2 Non-Proprietary Security Policy," which is submitted with the IDS, for further details concerning the particulars of this module.

As shown in the plan view of FIG. 1A, the apparatus 10 is mountable in a standard electronic rack (not shown) by way of brackets 12. A front bezel 14 coupled to the module's chassis provides a front cover, from which various aspects of the user interface of the module (bezel lock 16 and various indicator LEDs 18) can be seen and accessed. The bezel 14 contains slots 20 to allow for airflow. However, it should be mentioned that in this example, slots 20 do not pose a security risk, because various internal structures (not shown) naturally block viewing of critical structures. Hence there is no need in this example to obscure possible viewing of internal structures through the front face with an opacity baffle. However, an opacity baffle could optionally be used on the front face of the apparatus 10, as discussed further below, A view of the back face 21 of the apparatus 10—which in this example is more critical from the vantage point of security—is shown in FIG. 1B, including typical structures such as various electronic ports 22 (USB ports, network ports, etc.), some of which are coupleable to the Internet and to the computer system which the apparatus 10 protects. Also included are AC power ports 24, cooling fans 26, and expansion slots 28, which in FIG. 1B are blocked by blanks. Portions of the back face 21 not involving these structures are covered by a ventilation panel 30, which comprises a sheet of metal with a plurality of openings 32. Such openings 32 in the ventilation panel 30 are useful to allow airflow through the apparatus 10, and as noted earlier are useful in reducing the temperature inside the apparatus. Unfortunately, openings 32 also comprise a security risk, as critical internal structures may be viewable through such openings.

Figure 3:
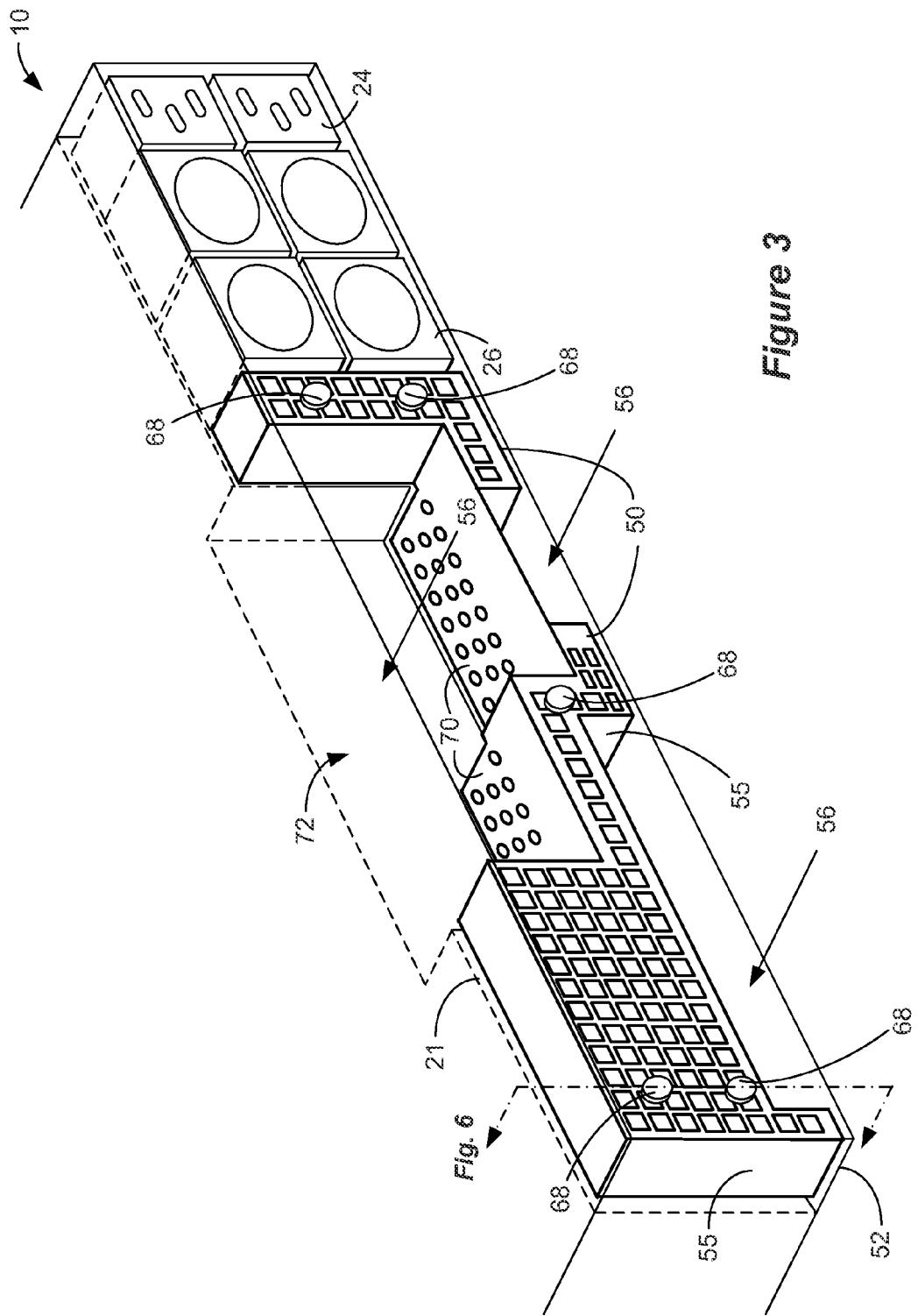

FIGS. 2 and 3 show an opacity baffle 50 for visually obscuring these openings 32, with FIG. 2 showing the baffle 50 in isolation relative to the back face 21 of the apparatus 10 before it is installed, and FIG. 3 showing the baffle affixed to the back face once it is installed using fasteners 68. (Ports 22 and expansion slots 28, illustrated previously in FIG. 1B, are not shown again in detail in FIG. 2 for simplicity). As explained in detail subsequently, the fasteners 68 pass though fastener holes 53, 67 in the baffle 50 and fastener holes 33 in the ventilation panel 30 of the back face 21 to permanently secure the baffle 50 to the apparatus 10. Five fasteners 68 are shown, but different numbers, including a single fastener, could be used as well.

Note in FIG. 2 that the back face 21 of the apparatus 10 is recessed 54 relative to the back of the chassis 52 to accommodate the thickness t of the baffle 50, such that when the baffle is installed (FIG. 3), it is generally flush with the chassis. Making the baffle 50 flush with the chassis 52 once it is installed is preferred to prevent tampering with the baffle 50, because the baffle 50 in the recessed position is more difficult to grab or pull. Recessing of the back face 21 with respect to the chassis 52, however, is not strictly necessary. The baffle 50 can instead be coupled to a back face 21 flush with the chassis 52 (not shown), even if this means that the opacity baffle 50 will protrude from the back face of the chassis 52 and is thus susceptible to tampering. In this scenario, other measures, such tamper-evident seals between the baffle 50 and the back face 21 or the chassis 52, could in used to indicate whether a person has attempted to rip the baffle 50 away from the back face 21 of the apparatus 10.

As shown in FIG. 3, the shape of the baffle 50 contains blank areas 56 that do not cover the various structures (ports 22, expansion slots 28, etc.) to which a user may need access, and which are already visually secure. The shape of the baffle 50, and hence location of the blank areas 56, will vary depending on the location of the relevant structures on the back face 21 of the apparatus 10.

Figure 4:
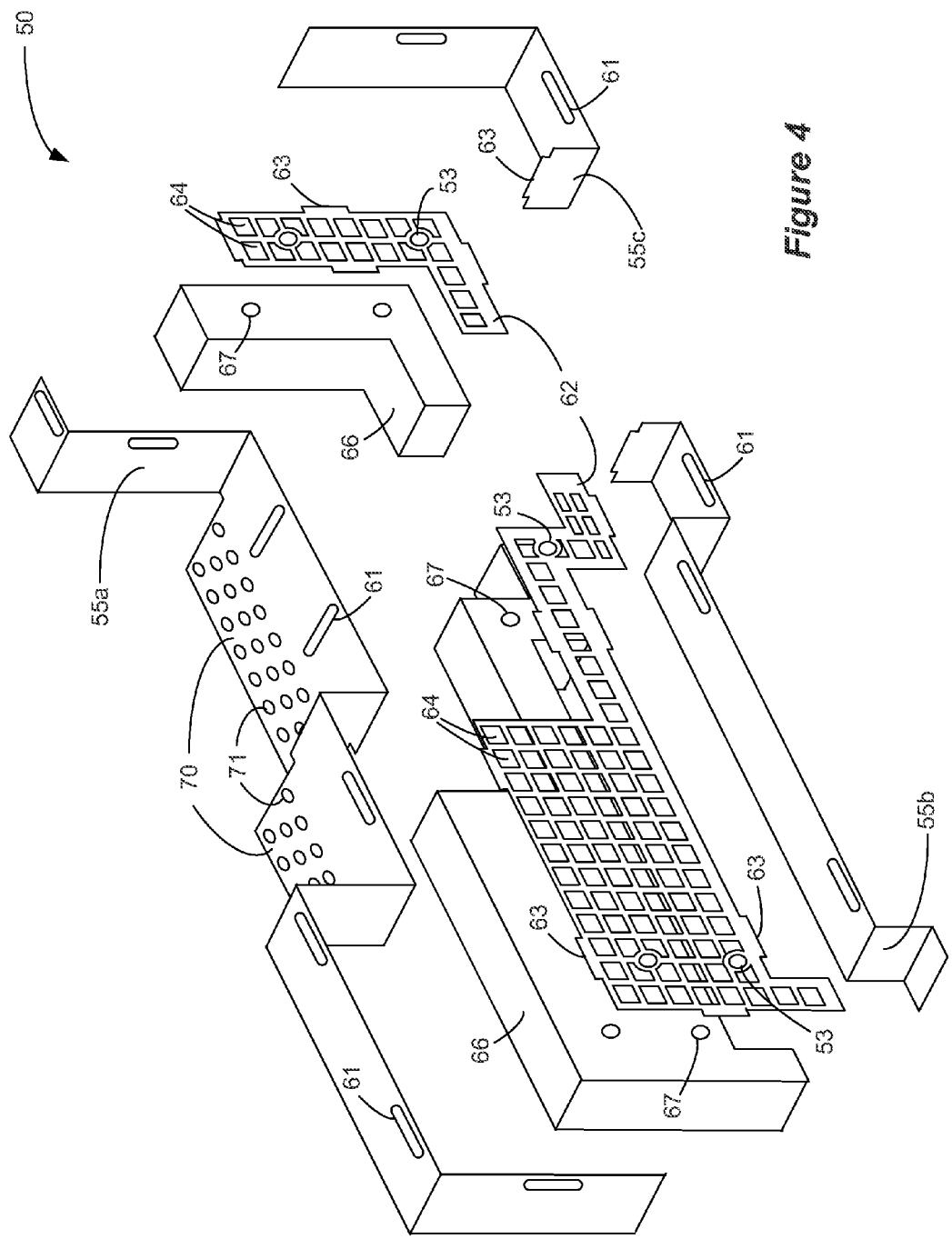
FIG. 4 shows the components in the baffle and how they are assembled.

The opacity baffle 50 can be made in any number of ways, but as shown in the example of FIG. 4, comprises metallic edges 55, one or more metallic grills 62 having openings 64, and one or more pieces of ventilation material 66 generally corresponding to the shape of the grill(s) 62. The number of edges 55, grill(s) 62, and pieces of ventilation material 66, will depend on the location of the structures on the back face 21. In the illustrated example, three edges 55a-c, two grills 62, and two pieces of ventilation materials 66 are used, although these numbers are only particular to this example. In other examples, the baffle 50 could comprise only one edge 55, a single grill 62, and a single corresponding block of ventilation material 66. Notice that the grill(s) 62 include fastener holes 53 to accommodate the fasteners 68, as will be described later.

As shown, the edges 55a-c comprise bands, which are positioned perpendicular to and around the grill(s) 62, such that tabs 63 on the metallic grill(s) 62 or the edges 55 slip through slits 61 in the edges. Once the tabs 63 are in place, they can be welded in the slots 61, thus resulting in a rigid assembly.

If necessary, the edges 55 can be formed with horizontal extensions 70 to block horizontal openings in the back face 21, or to otherwise provide another means of securing the baffle 50 to the back face 21. This is useful in particular if the back face 21 is not flat. For example, and as shown in FIG. 3, the area 72 in which the expansion slots 28 are located is recessed with respect to the back face 21, and thus horizontal extensions 70 can cover the bottom of this recessed area 72. Although not shown, screws or other tamper-resistant attaching means, including fasteners 68, can be used to secure the horizontal extensions 70 to the back face 21. As shown in FIG. 4, the horizontal extensions 70 can include small ventilation holes 71 that are not susceptible to tampering and prevent viewing of internal structures.

The edges 55 and the grill(s) 62 can comprise aluminum or steel for example, but can be made out of other metals or materials as well. For example, the edges 55 and grill(s) 62 can be molded from hard plastic as a single piece. One skilled in the art will recognize on the basis of this disclosure that the baffle 50 can be made in any number of ways, and that the manner shown is simply illustrative of one example.

After the edges 55 and the grill(s) 62 are formed, ventilation material 66 is affixed parallel and adjacent to a back face of the grill 60. The ventilation material 66 preferably comprises any suitable material that is opaque, but which will allow sufficient airflow, and thus allow openings 32 in the underlying ventilation panel 30 of the back face 21 (FIG. 1B) and openings 64 in the grill 62 to dissipate heat. In one example, the ventilation material 66 comprises QuadraFoam™ with a porosity of 10 PPI, a well-known polyurethane foam material used in air filters. However, other opaque but breathable materials can be used for the ventilation material 66 as well. The ventilation material 66 can be press fit against the grill(s) 62 and held in place by the edges 55 due to friction, although the ventilation material 66 could also be glued to the grill(s) 62 or the edges 55 for example. The interaction between the fasteners 68 and the fastener holes 57 in the ventilation material 66 will also help to hold the ventilation material in pace after the fasteners are inserted therethrough, as discussed further below. It is preferred that the openings 32 in the ventilation panel 30 and openings 64 in the grill(s) 62 of the baffle 50 generally align to promote air flow to the interior of the apparatus 10. However, this is not strictly necessary, as the air can readily flow transversely through the ventilation material 66 between the ventilation panel 30 and the grill(s) 62. Notice that the ventilation material 66 includes fastener holes 67 aligning with the fastener holes 53 in the grill(s) 62 to accommodate the fasteners 68, which are now discussed.

Figure 5:
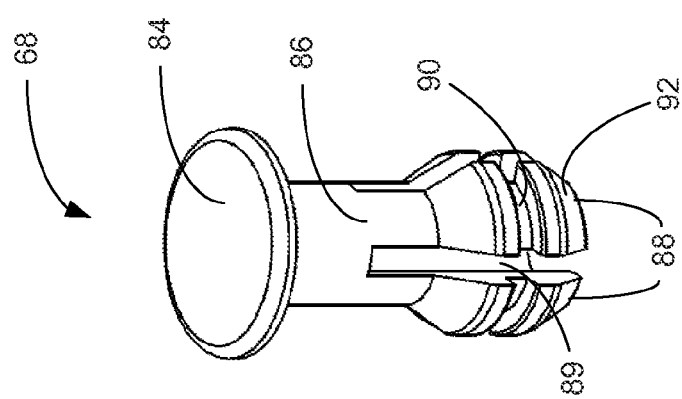

Fasteners 68 are used to couple the baffle 50 to the back face 21 of the apparatus 10 as shown in FIG. 3. Fasteners 68 can be made in any number of ways, but an example fastener 68 is shown in further detail in FIG. 5. In the illustrated example, the fasteners 68 comprise plastic pins made from hard plastic that can be pressed through fastener holes 53 and 67 in the baffle 50, and through fastener holes 33 in the ventilation panel 30 of the back face 21, as shown in the cross section of FIG. 6. The fasteners 68 comprise a flat pushing surface 84, a shaft 86, and a plurality of deformable extensions 88 (four in the illustrated example) formed around a hollow core 89 and containing grooves 90 for receiving the fastener holes 33 in the ventilation panel 30. The fasteners 68 are configured to be pushed in one direction through the fastener holes, but cannot be removed away from the fastener holes 33 in the back face 21 when caught thereon, as explained further below.

Figure 6:
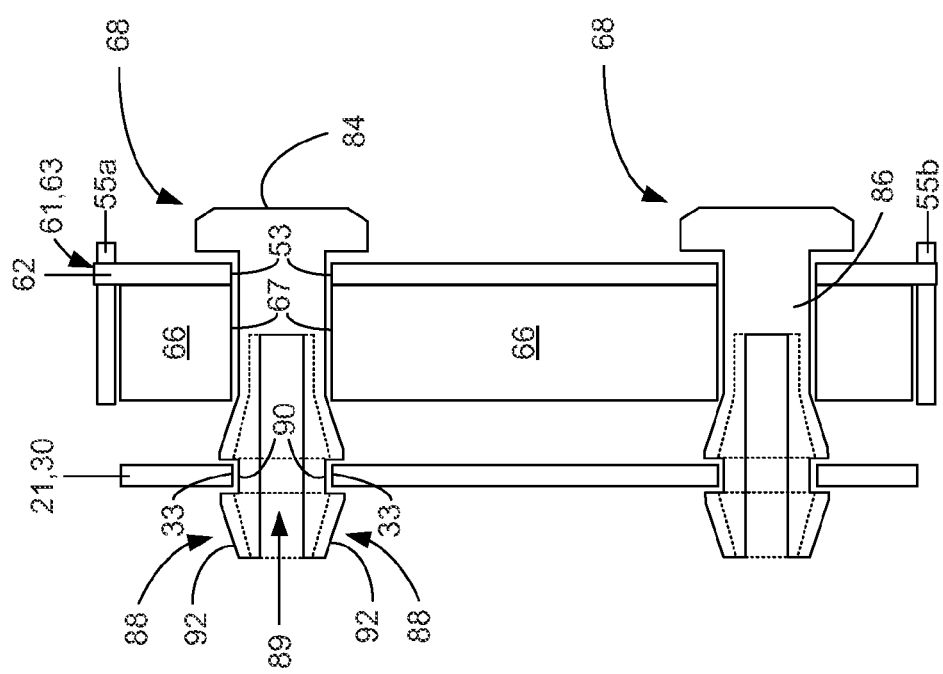
FIGS. 5 and 6 show fasteners used to secure the baffle to the back face of the apparatus in plan and cross-sectional views respectively.

The extensions 88 have beveled edges 92 to allow the fasteners 68 to be positioned through both the fastener holes 53 and 67 in the baffle 50 and fastener holes 33 in the ventilation panel 30 respectively. When a user presses on the flat pushing surface 84 to press a fastener 68 through fastener holes, the extensions 88 will bend toward each other, as aided by the beveled edges 92. Even though the grooves 90 can catch on the fastener holes 53 in the grill(s) 62, a manufacturer during assembly of the fasteners 68 into the baffle 50 depress the extensions 88 to move the grooves 90 passed the fastener holes 53. Then the ventilation material 66 can be pushed over the beveled edges 92 to secure the ventilation material 66 in place. With the baffle 50 so assembled with the fasteners 68, the customer need only press the fasteners 68 into the fastener holes 33 on the ventilation panel 30 to secure the baffle 50 in place. The grooves 90 will catch on the fastener holes 33 in the ventilation panel 30, as shown in FIG. 6. Once the fasteners holes 33 in the ventilation panel 30 are caught within the grooves 90 in the fasteners 68, the baffle 50 cannot be pulled away from the back face 21 without evident tampering. Specifically, the top cover 100 of the apparatus 10 (FIG. 1A) would have to be removed, and then the extensions 88 depressed by force to back the fasteners 68 away from the back face 21. However, tamper-evident seals 102 (FIG. 1A) on the top cover 100, and/or any other security measures taken with respect to the top cover 100, can provide assurance that this cannot happen without notice. Note that the length of shaft 86 is only slightly longer than the thickness t of the baffle, thus allowing the baffle 50 to be tightly secured to the back face 21 of the apparatus without wiggling.

Typically, the producer of the baffle 50 will push the fasteners 68 though the fastener holes 53, 67 in the baffle 50, leaving it to the apparatus customer to then press the fasteners 68 through the fastener holes 33 in the ventilation panel 30 if desired to secure the baffle 50. In this regard, the baffle 50 and fasteners 68 can be sold with or provided separately from the electronic apparatus 10, thus allowing the customer to add a baffle 50 to their apparatus 10 or not, depending on their security needs. The basic electronic apparatus 10 thus can be made similarly for all markets, rendering module production more efficient. In the illustrated example, the apparatus 10 need only minor customization to accommodate potential use of the baffle 50, specifically the provision of fastener holes 33, and a back face 21 that is recessed 54 (FIG. 2).

Other modifications to the baffle 50, or the baffle 50/apparatus 10 system, are possible. For example, the baffle 50 can be secured to the apparatus 10 in other tamper-evident ways not requiring the use of fasteners 68. In such a case, the apparatus 10 need not be formed with fastener holes 33. In short, if the baffle 50 is affixed to the apparatus 10 in other ways, not even minor customization of the apparatus to receive the baffle may be required.

Although the baffle 50 is preferably formed using ventilation material 66, this is not strictly required if the grill(s) 62 can be formed in such a manner so as to provide air flow while still being visually secure. For example, a three-dimensional grill structure, such as two or more grills offset in different planes from one another, can provide visually security, particularly if the opening 64 in the grills are not aligned. Or the grill can be formed using three-dimensional slats or other structures which impair visualization through its openings. The grill 60 can also provide metal or plastic inserts that are louvered to visually obscure the inside of the apparatus.

Finally, although the illustrated example shows use of the baffle 50 in conjunction with a back face 21 of an apparatus 10, it is not so limited. A baffle can be used to cover any visually unsecured openings in an apparatus, regardless whether such openings comprise ventilation holes for the apparatus, and regardless of where such openings are found on the apparatus.

Although particular embodiments of the present invention have been shown and described, it should be understood that the above discussion is not intended to limit the present invention to these embodiments. It will be obvious to those skilled in the art that various changes and modifications may be made without departing from the spirit and scope of the present invention. Thus, the present invention is intended to cover alternatives, modifications, and equivalents that may fall within the spirit and scope of the present invention as defined by the claims.

What is claimed is:

1. A baffle for obscuring visualization into first openings of an electronic apparatus, comprising:
   at least one grill containing second openings, wherein the at least one grill is sized to cover the first openings on the electronic apparatus;
   ventilation material positioned parallel with each grill, wherein the ventilation material obscures visualization through the second openings in the at least one grill and allows for air flow through the second openings in the at least one grill;
   at least one edge positioned around the at least one grill and the ventilation material to form a rigid assembly; and
   at least one fastener hole passing through the rigid assembly, each fastener hole of the at least one fastener hole configured to receive a respective fastener configured to affix the rigid assembly to the electronic apparatus,
   wherein the at least one grill has a portion configured for covering at least a part of a recess area of the electronic apparatus, the recess area allowing for accessing expansion slots of the electronic apparatus, the portion of the at least one grill having ventilation holes.

2. The baffle of claim 1, wherein the ventilation material is opaque.

3. The baffle of claim 1, wherein the ventilation material comprises a foam material.

4. The baffle of claim 1, wherein the ventilation material is adjacent to each grill of the at least one grill.

5. The baffle of claim 1, wherein the second openings are configured to correspond with positions of the first openings of the electronic apparatus.

6. The baffle of claim 1, wherein the at least one grill comprises tabs meeting with slots in the at least one edge.

7. The baffle of claim 6, wherein the tabs are welded in the slots.

8. The baffle of claim 1, wherein the at least one edge comprises a band, wherein the band is perpendicular to the at least one grill.

9. The baffle of claim 1, wherein the at least one edge is a plurality of edges, the edges comprising horizontal extensions.

10. The baffle of claim 1, wherein the at least one fastener hole passes through the at least one grill and the ventilation material.

11. The baffle of claim 1, wherein the respective fastener is positioned through each fastener hole, wherein each fastener is configured to affix the rigid assembly to the electronic apparatus.

12. A system, comprising:
    an electronic apparatus, wherein the electronic apparatus comprises:
    a face having first,
    a recess area allowing for accessing expansion slots of the electronic apparatus, the recess area recessed with respect to the face of the electronic apparatus, and
    first fastener holes each configured to receive a respective fastener of a plurality of fasteners; and
    a baffle, wherein the baffle obscures visualization into the first openings and allows for air flow through the first openings,
    wherein the fasteners are configured to affix the baffle to the electronic apparatus, wherein the fasteners are configured to catch on the first fastener holes when pushed therethrough, wherein the baffle comprises at least one grill containing second openings, wherein the at least one grill is parallel to the face when the baffle is affixed to the electronic apparatus, and wherein the at least one grill has a portion configured for covering at least a part of the recess area of the electronic apparatus, the portion of the at least one grill having ventilation holes.

13. The system of claim 12, wherein the face is recessed within a chassis of the electronic apparatus to accommodate a thickness of the baffle when the baffle is affixed thereto, the recessed area being further recessed from the face within the electronic apparatus.

14. The system of claim 12, wherein the first fastener holes are on the face.

15. The system of claim 12, wherein the fasteners comprise a groove, wherein the groove is configured to catch on an edge of the first fastener holes.

16. The system of claim 12, wherein the face comprises a ventilation panel, and wherein the first openings are ventilation openings.

17. The system of claim 12, wherein the face comprises a back face of the electronic apparatus.

18. The system of claim 12 wherein the electronic apparatus comprises a cryptographic module or a gateway.

19. The system of claim 12, wherein the baffle comprises second fastener holes to accommodate the fasteners.

20. The system of claim 12, wherein the fasteners are configured to be pushed toward the first fastener holes, but are configured to not be removed away from the first fastener holes when caught thereon.

21. The system of claim 12, wherein the baffle further comprises a ventilation material positioned parallel with each grill of the at least one grill, wherein the ventilation material obscures visualization through the second openings in the at least one grill and allows for the air flow through the second openings in the at least one grill.

22. The system of claim 21, wherein the ventilation material comprises a foam material.

23. The system of claim 21, further comprising at least one edge positioned around the at least one grill and the ventilation material to form a rigid assembly.

24. The system of claim 23, wherein the at least one edge comprises a band, wherein the band is perpendicular to the at least one grill.

25. The system of claim 24, wherein the band is recessed inside a chassis of the electronic apparatus when the baffle is affixed to the electronic apparatus.

26. The system of claim 12, wherein the baffle is flush with a chassis of the electronic apparatus when the baffle is affixed to the electronic apparatus.

* * * * *